(12) United States Patent
Raff

(10) Patent No.: US 9,886,065 B2
(45) Date of Patent: Feb. 6, 2018

(54) TRIMLESS GLASS ENCLOSURE INTERFACE

(71) Applicant: Apple Inc., Cupertino, CA (US)

(72) Inventor: John Raff, Menlo Park, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 15/060,490

(22) Filed: Mar. 3, 2016

(65) Prior Publication Data

US 2016/0209882 A1 Jul. 21, 2016

Related U.S. Application Data

(63) Continuation of application No. 14/668,799, filed on Mar. 25, 2015, now Pat. No. 9,285,833, which is a continuation of application No. 13/908,970, filed on Jun. 3, 2013, now Pat. No. 9,047,044.

(60) Provisional application No. 61/715,970, filed on Oct. 19, 2012.

(51) Int. Cl.
*G06F 1/16* (2006.01)
*H05K 5/02* (2006.01)
*H04M 1/02* (2006.01)

(52) U.S. Cl.
CPC .............. *G06F 1/1656* (2013.01); *G06F 1/16* (2013.01); *G06F 1/1626* (2013.01); *G06F 1/1637* (2013.01); *H04M 1/0266* (2013.01); *H05K 5/0217* (2013.01); *Y10T 156/10* (2015.01)

(58) Field of Classification Search
CPC ..... G06F 1/1601; G06F 1/1626; G06F 1/1637
See application file for complete search history.

(56) References Cited

U.S. PATENT DOCUMENTS

| | | | |
|---|---|---|---|
| 4,129,671 A * | 12/1978 | Greenberg | B44C 5/0407 359/851 |
| 8,199,477 B2 | 6/2012 | Mathew et al. | |
| 8,437,131 B2 * | 5/2013 | Dai | B29C 45/14377 312/223.2 |
| 8,592,693 B2 | 11/2013 | Dai | |
| 8,594,755 B1 | 11/2013 | Tages et al. | |
| 8,737,045 B2 * | 5/2014 | Dai | B29C 45/14467 174/255 |
| 9,047,044 B2 | 6/2015 | Raff | |

(Continued)

FOREIGN PATENT DOCUMENTS

| | | |
|---|---|---|
| CN | 102117104 | 7/2011 |
| CN | 102544887 | 7/2012 |

(Continued)

OTHER PUBLICATIONS

International Search Report, Application No. PCT/US2013/061770, dated Jan. 20, 2014.
Written Opinion, Application No. PCT/US2013/061770, dated Jan. 20, 2014.
Taiwanese Patent Application No. 102137018—Office Action dated Jan. 15, 2016.

(Continued)

*Primary Examiner* — Anthony Q Edwards
(74) *Attorney, Agent, or Firm* — Brownstein Hyatt Farber Schreck, LLP

(57) ABSTRACT

An enclosure for a portable computing device can include a cover glass affixed to an enclosure without trim pieces disposed between the cover glass and the disclosure. In one embodiment, the enclosure can include an edge profile that can define a relatively large contact pad about the enclosure. The contact pad can distribute impact forces over a relatively large area and thereby protect the cover glass integrity.

20 Claims, 6 Drawing Sheets

(56) References Cited

U.S. PATENT DOCUMENTS

| | | |
|---|---|---|
| 9,285,833 B2 | 3/2016 | Raff |
| 2010/0315769 A1* | 12/2010 | Mathew ............... G06F 1/1637 361/679.29 |
| 2011/0005662 A1 | 1/2011 | Sung |
| 2011/0103041 A1 | 5/2011 | Mathew et al. |
| 2011/0287812 A1* | 11/2011 | Joo ..................... H04M 1/185 455/566 |
| 2011/0305875 A1 | 12/2011 | Sanford et al. |
| 2012/0033357 A1 | 2/2012 | Dai et al. |
| 2012/0194998 A1 | 8/2012 | McClure et al. |
| 2013/0128433 A1 | 5/2013 | Dannoux et al. |
| 2013/0279088 A1 | 10/2013 | Raff et al. |
| 2013/0329460 A1* | 12/2013 | Mathew .................. H05K 5/02 362/612 |
| 2014/0092564 A1* | 4/2014 | Chuang .................. H05K 7/06 361/730 |
| 2014/0111927 A1 | 4/2014 | Raff |
| 2015/0092334 A1* | 4/2015 | Hayashida ........... G06F 1/1601 361/679.21 |
| 2015/0198976 A1 | 7/2015 | Raff |

FOREIGN PATENT DOCUMENTS

| | | |
|---|---|---|
| CN | 202453764 | 9/2012 |
| EP | 1691263 A1 | 8/2006 |
| JP | 2010237493 A | 10/2010 |
| KR | 20120112746 A | 10/2011 |
| TW | 201140531 | 11/2011 |
| TW | M430143 | 5/2012 |
| WO | 2011084184 A1 | 7/2011 |
| WO | 2012030563 A1 | 3/2012 |
| WO | 2012064567 A1 | 5/2012 |

OTHER PUBLICATIONS

Supplementary European Search Report dated Jun. 8, 2016, directed to EP Application No. 13847350.9.
Korean Office Action dated Mar. 15, 2016, directed to KR Patent Application No. 10-2015-7012990.
Chinese Patent Application No. 201310489051—Office Action dated May 18, 2016.

* cited by examiner

TRIMLESS GLASS ENCLOSURE INTERFACE

CROSS-REFERENCE TO RELATED APPLICATIONS

This application is a Continuation of U.S. application Ser. No. 14/668,799, filed Mar. 25, 2015, and entitled "TRIMLESS GLASS ENCLOSURE INTERFACE", which is a Continuation of U.S. application Ser. No. 13/908,970, filed Jun. 3, 2013, and entitled "TRIMLESS GLASS ENCLOSURE INTERFACE", which issued on Jun. 2, 2015 as U.S. Pat. No. 9,047,044, which claims the benefit under 35 U.S.C. 119(e) of U.S. Provisional Patent Application No. 61/715,970, filed Oct. 19, 2012, and entitled "TRIMLESS GLASS ENCLOSURE INTERFACE", the contents of each application are incorporated herein by reference in their entirety for all purposes.

FIELD

The described embodiments relate generally to enclosures for portable computing devices and more particularly to glass interfaces with enclosures for portable computing devices.

BACKGROUND

Portable computing devices such as media players or tablet computers typically include a generous display configured to show a user graphical output and oftentimes the display is combined with a touch sensitive input device that allows the user to control the portable computing device.

As portable computing devices become more compact, the enclosure design and the display must also become smaller. However, simply size reducing older designs can provide a product that may not provide adequate display area or may not adequately protect a cover glass attached to the portable computing device. Furthermore, conventional device enclosures include trim gaskets, trim pieces, or other trim-protective features which may decrease the aesthetics of a final device.

Therefore, what is desired is a portable computing device with an enclosure design that can be reduced in size, that can increase aesthetic qualities, and that will adequately protect the cover glass.

SUMMARY

This paper describes various embodiments that relate to enclosures for a portable computing device. In one embodiment, a method for attaching a cover glass to an enclosure of a portable computing device absent a trim piece disposed between the cover glass and the enclosure is disclosed. The method includes affixing a display assembly to the enclosure, applying an adhesive to the enclosure, and attaching the cover glass to the adhesive.

In another embodiment, an enclosure for a portable computing device can include a body formed from a single and continuous piece of aluminum, the body including a bottom an four side walls, where at least one side wall includes a profile including a curve and an apex where the apex is arranged to be located on a 45 degree slope below an upper corner of the body, an opening configured to receive internal components, a support ledge configured to receive an adhesive and a cover glass configured to fit within the opening and bond to the adhesive on the support ledge.

In another embodiment, a personal computing device is disclosed. The personal computing device may be a tablet computer, telephone, media player, or other computing device. The device may include a body formed from a single and continuous piece of aluminum. The body may include a bottom and at least one side wall. The at least one side wall includes a profile including a curve and an apex arranged to be located on a slope below an upper corner of the body. The body may further include a cavity configured to receive internal components, a support ledge configured to receive an adhesive, and a cover glass configured to fit within the opening and bond to the adhesive on the support ledge.

Other aspects and advantages of the invention will become apparent from the following detailed description taken in conjunction with the accompanying drawings which illustrate, by way of example, the principles of the described embodiments.

BRIEF DESCRIPTION OF THE DRAWINGS

The described embodiments and the advantages thereof may best be understood by reference to the following description taken in conjunction with the accompanying drawings. These drawings in no way limit any changes in form and detail that may be made to the described embodiments by one skilled in the art without departing from the spirit and scope of the described embodiments.

DETAILED DESCRIPTION

Representative applications of methods and apparatus according to the present application are described in this section. These examples are being provided solely to add context and aid in the understanding of the described embodiments. It will thus be apparent to one skilled in the art that the described embodiments may be practiced without some or all of these specific details. In other instances, well known process steps have not been described in detail in order to avoid unnecessarily obscuring the described embodiments. Other applications are possible, such that the following examples should not be taken as limiting.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments may be used, and changes may be made without departing from the spirit and scope of the described embodiments.

Figure 1:
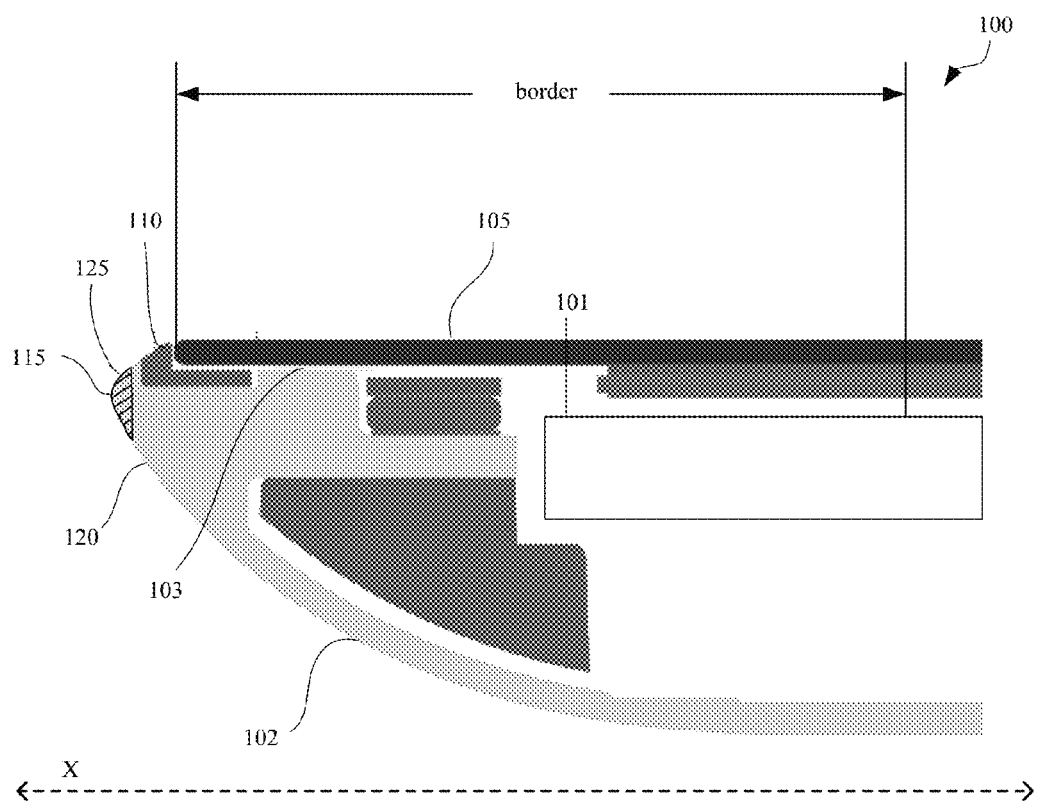
FIG. 1 (Prior Art) is a cross sectional view of a conventional portable computing device.

FIG. 1 is a cross sectional view of a conventional portable computing device 100. The portable computing device 100 can include an enclosure 102. The enclosure can form a cavity that can enclose various functional components for the portable computing device such as a battery, a processor, memory, wireless interfaces etc. The portable computing device 100 can include a display assembly 101 that can include a liquid crystal display, filters and a light source. The portable computing device 100 can include a cover glass 105 that can be attached to the enclosure 102 with an adhesive 103. Disposed between cover glass 105 and enclosure 102 is a trim piece 110. The trim piece 110 can absorb some shock that can be transmitted from enclosure 102 to cover glass 105 when portable computing device 100 is exposed to an impact along the X-axis as shown. Additionally trim piece 110 can be used to mask any tolerance build up problems that can be present in the design of portable computing device 100, particularly in the area of the interface between the cover glass 105 and the enclosure 102.

An impact along the X-axis can occur when portable computing device falls and lands on or near apex 115. The edge profile 120 near apex 115 can define a narrow contact pad 125 (shown with cross hatched lines). A consequence of the narrow contact pad 125 is that forces subjected to the region of the narrow contact pad 125 are concentrated and can deliver a relatively sharper shock or impact in the region near narrow contact pad 125, such as near cover glass 105. In some cases, a blow or impact to the narrow contact pad 125 can cause damage to cover glass 105, even with trim piece 110 available to absorb a portion of the impact forces.

Figure 2:
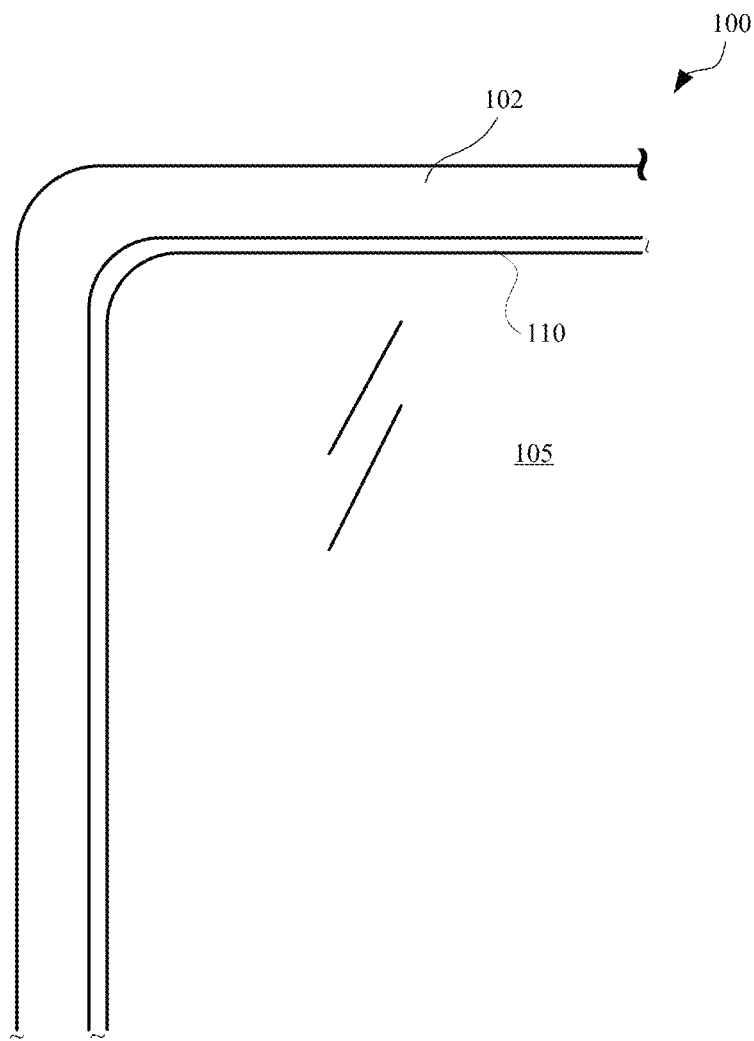
FIG. 2 (Prior Art) is a planar view of a portion of the computing device of FIG. 1.

FIG. 2 is a planar view of a portion of the computing device 100. As shown, the computing device 100, when viewed from above the cover glass 105, includes a clear view of the trim piece 110. The trim piece 110 extends about the cover glass 105, and therefore is seen while a user is manipulating or using computing device 100. As such, the trim piece 110 may detract from the overall aesthetic quality of computing device 100.

However, exemplary embodiments of the present invention provide methods and apparatuses which overcome these and other drawbacks, as described below.

Figure 3:
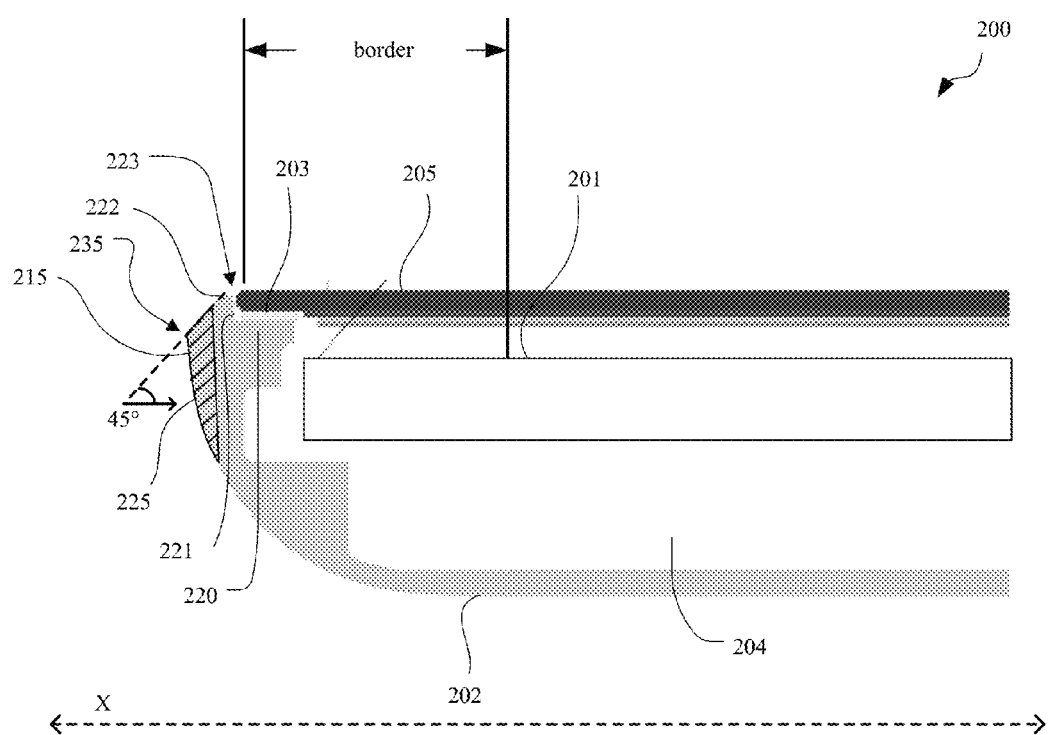
FIG. 3 is a cross sectional view of a portable computing device in accordance with an exemplary embodiment of the invention.

FIG. 3 is a cross sectional view of a portable computing device 200 in accordance with an exemplary embodiment of the invention. Portable computing device 200 can include an enclosure 202. The enclosure 202 can be formed from a resilient and sturdy material. In one embodiment, enclosure 202 can be formed from aluminum. Enclosure 202 can be shaped to form a cavity 204 to enclose and protect various components that can be included with the portable computing device 200 such as a processor, memory, wireless interfaces, battery, etc. Portable computing device can also include a display assembly 201 that can include a LCD display and a backlight. In one embodiment, the display assembly 201 can be configured to include a relatively smaller border area than conventional display assemblies. Smaller border areas can enable an active screen area to be affected to a lesser extent even when an overall size of the portable computing device 200 can be smaller than portable computing device 100.

Adhesive 203 can be disposed on a support 220 formed within enclosure 202. In one embodiment adhesive 203 can bond a cover glass 205 to enclosure 202. The cover glass 205 can be bonded directly to enclosure 202 without any extra layers between cover glass 205 and enclosure 202 (such as trim piece 110 shown above). In one embodiment machining operations for the enclosure 202, especially operations for forming support 220 and side wall 221 can be formed at relatively the same time thereby allowing relatively good control of tolerances associated with the opening configured to receive cover glass 205. Machining operations for cover glass 205 can also be well controlled enabling the cover glass 205 to fit relatively well with a highly controlled gap 223 between enclosure 202 and cover glass 205.

Enclosure 202 can include a gentle sweeping edge profile 225. The edge profile 225 can form a broad contact pad 215. The contact pad 215 can spread any impact forces received in this edge area over a relatively greater area than contact pad 125. This larger area can absorb and distribute impact forces through more of enclosure 202. The gentle sweeping edge profile 225 also provides a less prominent apex 235 in the edge area. The less prominent apex 235 can also help distribute impact forces received in the edge area. In one embodiment, apex 235 can be positioned on a 45 degree line emanating from top corner 222 of enclosure 202. In another embodiment, the apex 235 can be positioned on a line at a differing angle than that illustrated, according to any desired structural or aesthetic characteristics of a finished product.

According to one embodiment, device 200 weighs approximately 0.7 lbs. According to another embodiment, device 200 weighs less than about 0.7 lbs. According to yet another embodiment, the device 200 weighs less than about 1.4 lbs. Accordingly, the relatively low weight of device 200 further enhances the applicability of the edge profile 225, allowing for the clean lined top-down view without necessitating the additional trim piece 110 of computing device 100. However, in some embodiments, a trim piece somewhat similar to trim piece 110 may be included for additional protection of cover glass 205.

According to one embodiment, the gap 223 is approximately 0.05 mm. According to another embodiment, the gap 223 is less than about 0.05 mm. According to yet another embodiment, the gap 223 is slightly larger than about 0.05 mm. Accordingly, the small size of the gap 223 allows for a desirable and clean interface between the enclosure 202 and display cover glass 205 further enhancing aesthetics of the device 200.

Figure 4:
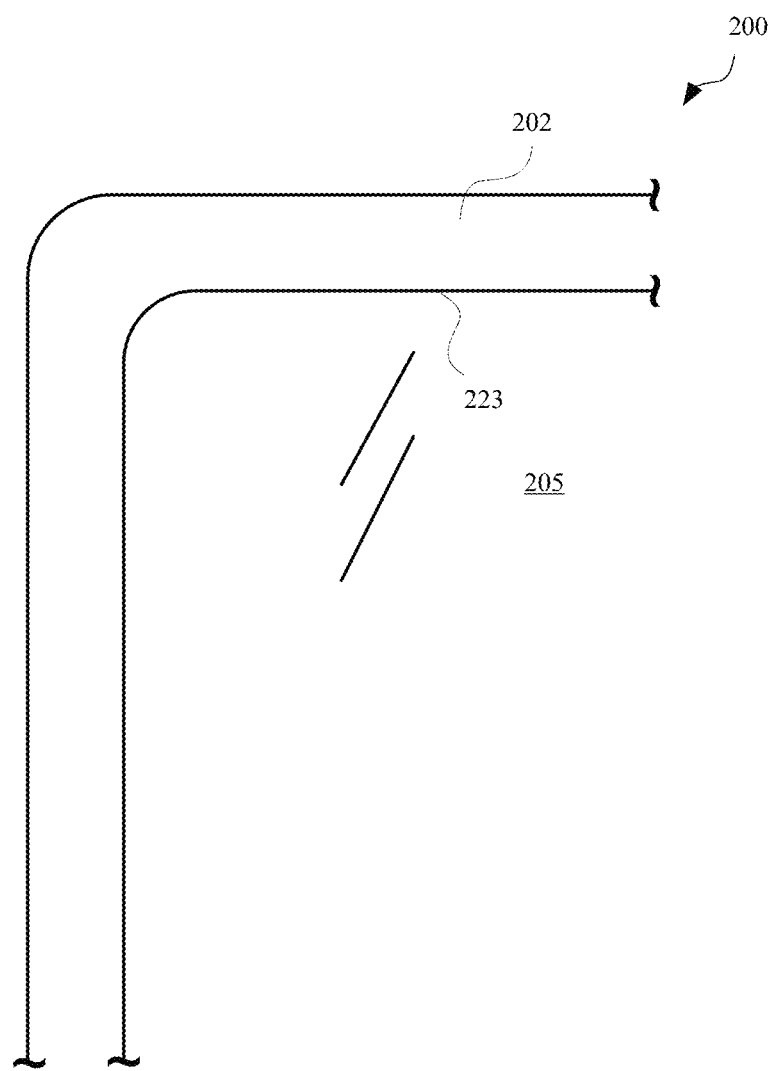
FIG. 4 is a planar view of a portion of the computing device of FIG. 3.

FIG. 4 is a planar view of a portion of the device 200. As shown, the device 200, when viewed from above the cover glass 205, includes a clean and desirable interface between cover glass 205 and enclosure 202, with only the relatively small gap 223 viewable. As such, the aesthetic quality of device 200 may be desirable.

Figure 5:
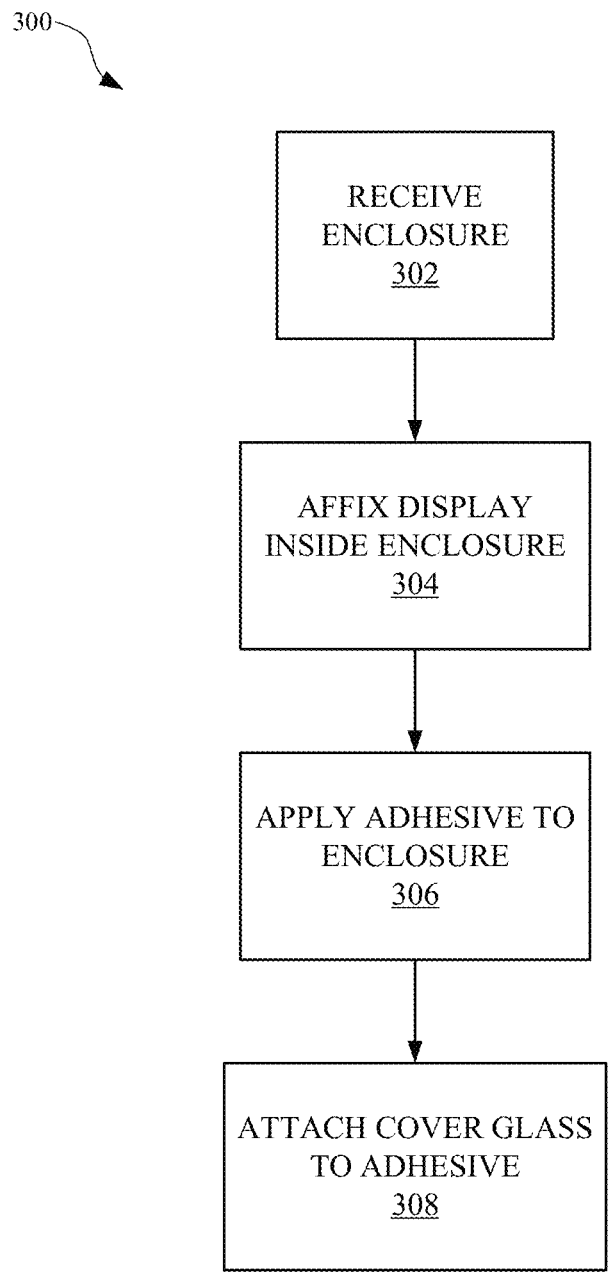
FIG. 5 is a flow chart of a method of forming a device in accordance with an exemplary embodiment of the invention.

FIG. 5 is a flow chart 300 of a method of forming a device similar to device 200, according to an exemplary embodiment of the invention. The method can begin in step 302 by receiving the enclosure 202. In step 304, a display assembly 201 can be mounted within the enclosure 202 and/or cavity 204. In step 306, adhesive 203 can be applied to the enclosure 202. In one embodiment, adhesive 203 can be applied to support 220 on enclosure 202. In another embodiment, adhesive 203 can be a pressure sensitive adhesive. In yet another embodiment, adhesive 203 can be a compliant foam with a pressure sensitive adhesive applied on two sides of the compliant foam. In step 308, the cover glass 205 can be attached to the adhesive.

As described above, the enclosure 202 may be received, a display assembly mounted, and a cover glass attached. However, the same may be varied in many ways. For example, pressure sensitive adhesive may be applied in any step preceding application of the cover glass 205. Furthermore, machining, polishing, and other steps may also be applicable.

Figure 6:
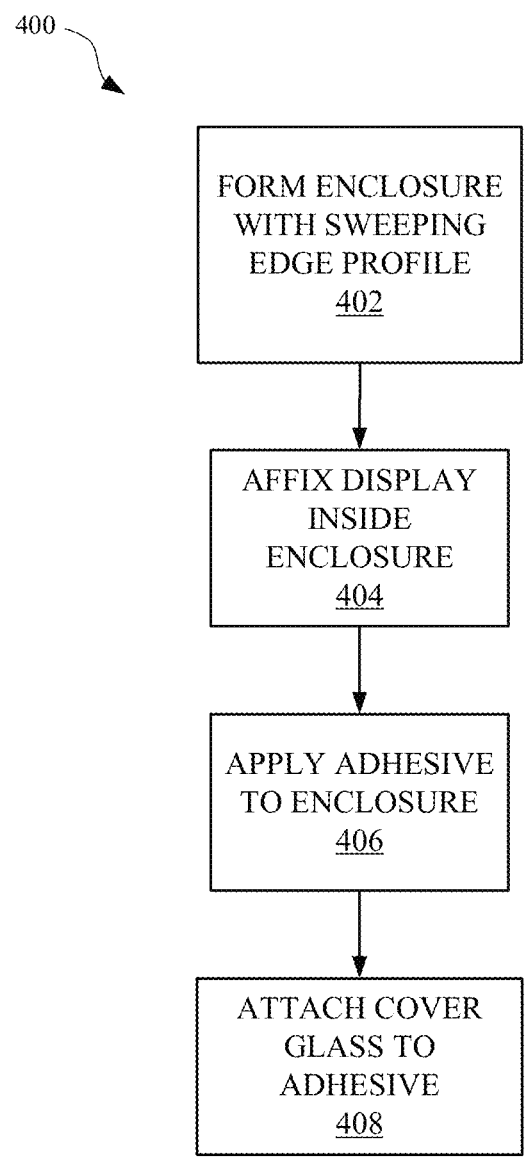
FIG. 6 is a flow chart of a method of forming a device in accordance with an exemplary embodiment of the invention.

For example, FIG. 6 is a flow chart 400 of a method of forming a device similar to device 200, according to an exemplary embodiment of the invention. The method 400 can begin in step 402 by forming the enclosure 202 with the sweeping edge profile 225 and associated sidewall 221 adjacent the support 220. The forming may include forming the enclosure 202 from a single piece of aluminum, for example, using a machining device, cutting device, or any other suitable device to form the features described herein.

In step 404, a display assembly 201 can be mounted within the enclosure 202 and/or cavity 204. In step 406, adhesive 203 can be applied to the enclosure 202. In step 408, the cover glass 205 can be attached to the adhesive.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data which can thereafter be read by a computer system. Examples of the computer readable medium include read-only memory, random-access memory, CD-ROMs, HDDs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. An electronic device housing, comprising:
    an enclosure of unitary construction defining:
        a sidewall;
        a support; and
        a top corner substantially surrounding the support;
    a cover glass affixed to the support such that an edge of the cover glass is set apart from the top corner by a void space;
    wherein the sidewall comprises:
        a curved region; and
        a planar region abutting the curved region at an apex, the apex defining an oblique angle.

2. The electronic device housing of claim 1, wherein the planar region extends from the apex to a top of the sidewall.

3. The electronic device housing of claim 2, wherein the apex defines an obtuse angle.

4. The electronic device housing of claim 1, wherein the cover glass further comprises beveled edges.

5. The electronic device housing of claim 4, wherein a top of the top corner is substantially even with a top surface of the cover glass, above the beveled edges.

6. The electronic device housing of claim 1, wherein a distance between the edge of the cover glass and the top corner is less than 0.05 mm.

7. The electronic device housing of claim 1, wherein the enclosure further defines a bottom surface of the electronic device housing.

8. The electronic device housing of claim 1, wherein:
    the enclosure is formed from aluminum; and
    the cover glass is formed from glass.

9. An electronic device housing, comprising:
    a body of unitary construction and defining:
        an interior cavity;
        a support; and
        a sidewall comprising:
            a top corner; and
            an exterior surface including:
                a planar surface extending from the top corner to an apex; and
                a curved surface extending from the apex and defining an oblique angle with respect to the planar surface at the apex;
    a cover glass at least partially received within the cavity and over the support.

10. The electronic device housing of claim 9, wherein the cover glass is attached to the support.

11. The electronic device housing of claim 10, further comprising an adhesive between the support and the cover glass.

12. The electronic device housing of claim 9, wherein the top corner of the sidewall and a top surface of the cover glass are coplanar.

13. The electronic device housing of claim 9, wherein the body is formed from aluminum.

14. The electronic device housing of claim 13, wherein the planar surface and the curved surface define an obtuse angle at the apex.

15. An electronic device, comprising:
    a housing of unitary construction defining:
        a sidewall at least partially defining a cavity in the housing and defining:
            a top corner defining an opening of the cavity;
            an exterior surface comprising an apex, a planar region extending between the apex and the top corner, and a curved region extending from the apex and defining an oblique angle with respect to the planar region; and
        an internal support;
    a cover glass received at least partially within the cavity and supported by the internal support; and
    an adhesive affixing the cover glass to the housing.

16. The electronic device of claim 15, wherein the planar region extends from the top corner to the apex at a 45 degree angle from a plane parallel to an exterior of the cover glass.

17. The electronic device of claim 15, wherein the curved region extends from the apex to a bottom surface of the housing.

18. The electronic device of claim 15, wherein the apex forms a border around the cover glass.

19. The electronic device of claim 18, wherein: the border slopes away from the cover glass; and the border is visible when the electronic device rests on a surface with the cover glass facing up.

20. The electronic device of claim 15, wherein the curved region near the apex is configured to distribute an impact force.

* * * * *